United States Patent
Grass

(10) Patent No.: US 10,686,450 B2
(45) Date of Patent: Jun. 16, 2020

(54) TEST AND CHARACTERIZATION OF AN EMBEDDED PLL IN AN SOC DURING STARTUP

(71) Applicant: GLOBALFOUNDRIES INC., Grand Cayman (KY)

(72) Inventor: Anthony E. Grass, Burlington, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 71 days.

(21) Appl. No.: 15/987,257

(22) Filed: May 23, 2018

(65) Prior Publication Data

US 2019/0363719 A1    Nov. 28, 2019

(51) Int. Cl.
*H03L 7/081* (2006.01)
*H03L 7/093* (2006.01)
*G01R 31/317* (2006.01)

(52) U.S. Cl.
CPC ........ *H03L 7/081* (2013.01); *G01R 31/31725* (2013.01); *H03L 7/093* (2013.01)

(58) Field of Classification Search
CPC ... H03L 7/06; H03L 7/08; H03L 7/081; H03L 7/0812; H03L 7/0814; H03L 7/0816; H03L 7/0818; H03L 7/085; H03L 7/093; G01R 31/317; G01R 31/31725; G01R 31/31726
See application file for complete search history.

(56) References Cited

U.S. PATENT DOCUMENTS

| | | | |
|---|---|---|---|
| 6,262,634 B1 | 7/2001 | Flanagan et al. | |
| 6,557,117 B1 | 4/2003 | Wu et al. | |
| 6,859,028 B2 | 2/2005 | Toner | |
| 7,238,383 B2 * | 7/2007 | Ghosh | C23C 14/12 427/255.23 |
| 7,380,189 B2 | 5/2008 | Konuk | |
| 2003/0053439 A1 * | 3/2003 | Abe | H04B 7/2681 370/347 |
| 2014/0225635 A1 | 8/2014 | Dasnurkar | |

* cited by examiner

*Primary Examiner* — Lincoln D Donovan
*Assistant Examiner* — Diana J. Cheng
(74) *Attorney, Agent, or Firm* — Gibbs & Riley, LLC; Anthony J. Canale

(57) ABSTRACT

Different delay counts are supplied to a counter to perform multiple frequency captures on the output of a phase-locked loop (PLL) device. A PLL frequency set signal is supplied to the counter for each of the multiple captures performed on the PLL device. The set signal causes the PLL device to transition from a relatively lower frequency state to a relatively higher target (lock) frequency state. A different time delay count is begun each time the set signal is detected at an input of the counter, and a trigger signal is output from the counter each time each of the different delay counts is complete. A frequency detector captures the frequency being output by the PLL device each time the trigger signal is received. Such forms a record of the frequency being output by the PLL device for each different time delay count.

20 Claims, 8 Drawing Sheets

TEST AND CHARACTERIZATION OF AN EMBEDDED PLL IN AN SOC DURING STARTUP

BACKGROUND

Field of the Invention

The present disclosure relates to phase locked loop (PLL) circuits of an embedded PLL in a system on a chip (SOC), and more specifically to methods and devices that test such PLL circuits during startup, when the PLL circuits are in the process of locking in on a target frequency.

Description of Related Art

A phase locked loop (PLL) circuit is used to provide an output signal having a steady, consistent frequency that can be used as a standard signal by other devices. To "lock" in on a certain frequency, PLLs use a phase/frequency detector, a charge pump, a loop filter, a voltage controlled oscillator (VCO), and a frequency divider. One feature of such devices is that the voltage controlled oscillator generates a clock signal with a phase and frequency that is a function of the voltage applied to the oscillator. The phase/frequency detector works with the voltage controlled oscillator and detects the phase difference between the voltage controlled oscillator output and the input signal to generate a phase control signal. This phase control signal is supplied to the charge pump, which increases or decreases the voltage across the loop filter, and such voltage controls the voltage controlled oscillator to set the oscillation frequency and phase.

When testing PLL circuits, test devices customarily record the PLL output frequency over time with an oscilloscope, frequency counter or spectrum analyzer; and/or such test devices start a counter/timer when the PLLs lock bit is set, and stop the counter/timer when the PLLs lock indicator bit is set (to determine how long it takes the PLL circuit to achieve the stable target lock frequency).

SUMMARY

Various capture devices are presented herein that include a counter device having an input for a set signal. The set signal is a phase-locked loop (PLL) frequency set signal that is supplied to a PLL register. The PLL register, upon receipt of the set signal, causes a PLL circuit to transition from a relatively lower frequency state to a relatively higher target frequency state.

Some implementations of these capture devices also include a control unit connected to the counter/timer. Such a control unit, if included, controls the counter to perform multiple captures on the PLL circuit using different delay counts. During such captures, the counter begins counting (counting up from zero to a count number, or counting down to zero from a count number) a different time delay count each time the set signal is detected at the input. The counter only counts one of the different delay counts during any given capture of the multiple captures that will be performed. If the control unit is not utilized, a series of single delay counts (different from one another) can be supplied (potentially manually) to the counter to perform the series of individual captures. While both implementations achieve the same result, the use of the control unit automates such a potentially manual process of supplying the different delay counts to the counter.

The counter outputs a trigger signal each time each of the different delay counts is complete (a count is complete when a countdown is performed from the count number down to zero, or the counter counts up from zero to the count number). In greater detail, the counter includes a time delay count input for receiving the different delay counts, one at a time, and a clock input for receiving a clock signal. The counter can also include storage to store the time delay count, and logic circuitry (e.g., a comparator, etc.) that will output the trigger signal when the counting of each of the delay counts is complete. An amplifier, connected to the counter, can be included to amplify the trigger signal output from the counter.

With these capture devices, some form of frequency detector (e.g., oscilloscope, frequency counter, spectrum analyzer, etc.) is connected to the PLL circuit. The frequency detector captures the frequency being output by the PLL circuit each time the trigger signal is received by the frequency detector. In other words, each time after counting each different time delay count in each individual capture (of a series of capture operations) the frequency detector captures the PLL circuit frequency. Each individual capture operation begins with receipt of a PLL set signal, and ends with capture of a PLL frequency. Therefore, through the performance of the series of capture operations, the frequency detector captures the PLL frequency at different counts from the set signal. Again, each individual capture in the series of capture operations uses only one time delay count and captures only one PLL circuit frequency; and because the delay counts are different from one another in each of the individual capture operations, this captures the PLL circuit frequency at different counts. Thus, the frequency detector outputs a record of the frequency being output by the PLL circuit after receiving each trigger signal.

Additionally, a reporting unit, connected to the frequency detector, stores the record of the frequency being output by the PLL circuit for the different delay counts performed during the different captures in the series. The reporting unit calculates/produces a plot of the different frequencies being output by the PLL circuit at the different delay counts (and outputs the plot). Such a plot is a curve of frequency over counts/time that illustrates the slope of the plot when the PLL circuit is transitioning from the relatively lower frequency state to the relatively higher target frequency state, and also illustrates the number of oscillations that occur before the PLL circuit locks at the target frequency state.

Depending upon the implementation of the capture device utilized, various methods herein can control a counter to perform multiple captures on a PLL circuit by supplying different delay counts from a control unit to the counter. The process of supplying different delay counts supplies the delay counts to an input of the counter. These methods also supply a set signal to the counter for each of the multiple captures performed on the PLL circuit. Again, the set signal is a phase-locked loop (PLL) frequency set signal that is supplied to a PLL register, and that causes a PLL circuit to transition from a relatively lower frequency state to a relatively higher target frequency state.

A clock signal is received into a clock signal input of the counter to provide a basis upon which the counter performs counting operations. These methods begin counting a different time delay count each time the set signal is detected at the input of the counter, and output a trigger signal from the counter each time each of the different delay counts is complete. Such processing can amplify the trigger signal output from the counter using an amplifier connected to the counter. With these methods, a frequency detector is used to capture the frequency being output by the PLL circuit each time the trigger signal is received. Also, such methods can store the record of the frequency being output by the PLL circuit for multiple different delay counts using a reporting unit connected to the frequency detector.

This allows these methods to output a record of the frequency being output by the PLL circuit from the frequency detector after receiving each trigger signal for each different time delay count. In one example, the methods herein can calculate/produce a plot of different frequencies being output by the PLL circuit at different delay counts using the reporting unit, where the plot is output from the reporting unit. The plot comprises a curve of frequency over counts that illustrates the slope of the plot when the PLL circuit is transitioning from the relatively lower frequency state to the relatively higher target frequency state, and also illustrates the number of oscillations that occur before the PLL circuit locks at the target frequency state.

Again, each time after counting each different time delay count in each individual capture of the series of capture operations, the frequency detector captures the PLL circuit frequency. Therefore, through the performance of a series of capture operations, the frequency detector captures the PLL frequency at different counts from the set signal. Each individual capture operation begins with receipt of a PLL set signal, and ends with capture of a PLL frequency. Again, each individual capture in the series of capture operations uses only one time delay count and captures only one PLL circuit frequency; and, because the delay counts are different from one another in each of the individual captures, this captures the PLL circuit frequency at different counts.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
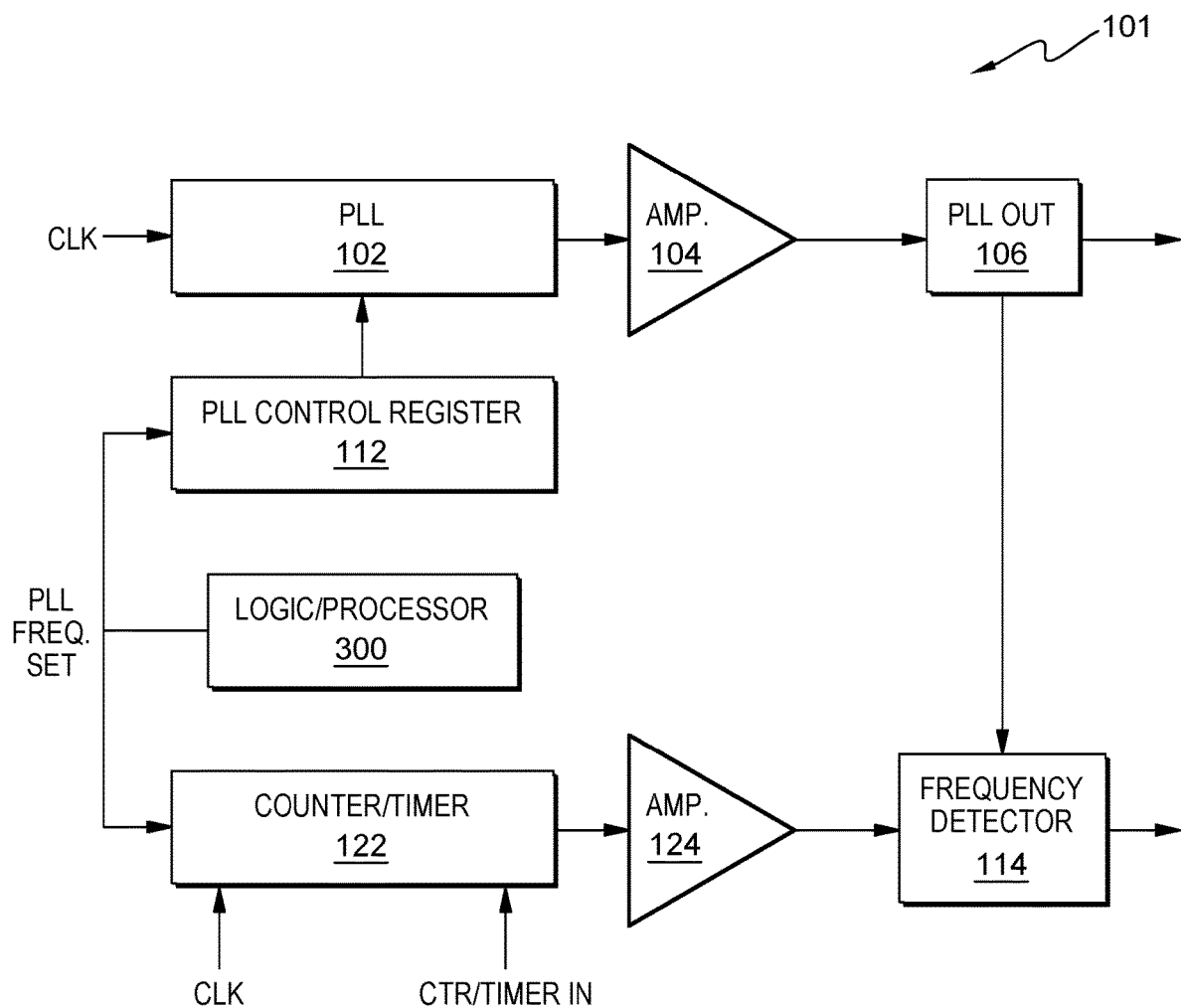
FIGS. 1-4 are schematic conceptual diagrams of capture/test devices according to embodiments herein.

As mentioned above, PLL test devices customarily record the PLLs frequency over time and/or such test devices start a counter/timer when the PLLs lock bit is set, and stop the counter/timer when the PLLs lock indicator bit is set (to determine how long it takes the PLL circuit to achieve the stable target lock frequency). However, such test devices do not define a zero point of time when the PLL was set to its target frequency, and therefore do not allow for direct frequency measurement of the PLL as a function of time, do not allow direct measurement of the PLLs lock time, and do not allow direct measurement of a PLLs frequency, which prevents such devices from rendering a frequency verses time curve for the PLL devices.

In greater detail, recording a PLLs frequency output over time without reference to when the PLLs target frequency was set is problematic, and this is especially true because the absolute lock time of a PLL cannot be determined without a reference to when the PLLs target frequency was set. In addition, such testing is impractical from a logistical point of view, given the recording limitations of digital sampling oscilloscopes (DSO) and spectrum analyzers. The time window of the PLL lock time is typically in the microsecond range and the target frequency of the PLL can be anywhere from 33 MHz to over 5 GHz. When the time range of a DSO is set to observe the relatively large time window of the PLLs lock time, the sample rate required to observe the PLL lock frequency exceeds the memory capacity of the DSO. As a result, the waveform rendered by the DSO under these conditions can be aliased and may be of no value. Further, starting a counter/timer when the PLLs target frequency is set and stopping the counter/timer when the PLLs lock bit is set gives a good measurement of the PLLs lock time; however, the frequency of the PLL is not actually validated at the point in time when the lock bit is set. Therefore, this testing cannot guarantee that the PLL is set at the target frequency.

In view of such issues, the methods and devices disclosed herein provide a practical way to produce a PLL frequency verses time characteristic curve and validate that the PLL is locked at the target frequency after an arbitrary amount of time. Thus, this disclosure presents a design for test (DFT) with a test mode which enables characterization and validation of the PLL circuit. Features of the disclosed methods and devices include an on-device programmable counter/timer which is started at the time the PLL is first instructed to achieve the target (lock) frequency, where the counter/timer is used as a trigger for a frequency measurement device. More specifically, the on-device programmable counter/timer is used as a trigger for the frequency measuring device such as a frequency counter, oscilloscope or spectrum analyzer. Thus, the user programs the counter/timer to record the frequency of the PLL at any point in time after the set signal, at which the PLL has started to build toward the target frequency. The trigger signal generated by the counter/timer (and the PLL output amplifier) allows the frequency to be recorded after the time delay programmed into the counter/timer. The PLLs frequency verses time characteristic curve is recorded by repeating this measurement using multiple delay times.

In greater detail, these methods/devices use a PLL start (set) signal, which is an electrical signal indicating that the PLL to be characterized has been initialized and activated and is starting to seek its target lock frequency. With the set signal, the PLL control registers are initialized with data which will set the PLL to operate at the target frequency. The point in time when the PLL receives such a set signal corresponds to the time zero point of the PLLs lock time measurement.

For example, the counter timer can first be initialized with a time interval (delta t), and the counter timer circuit can be simultaneously started with the PLL device by such a PLL set signal. The counter timer circuit outputs the trigger to start the measurement of the PLL output frequency after the programmed time interval following the set signal. Also, an on-device amplifier allows the PLL signal to be more easily measured by a frequency measuring device (e.g., oscilloscope, frequency counter, spectrum analyzer, etc.). Thus, the trigger signal (output when the counter reaches the time interval) causes the frequency measuring device to record the then-current frequency being output by the PLL circuit, and this renders one point in the frequency verses time curve (or transfer function) of the PLL. By repeating the above steps using different time intervals programmed into the counter timer, the complete frequency verses time curve (or transfer function) and the PLL lock time are rendered point by point.

Such features provide a practical means of recording the entire frequency verses time characteristic curve of a PLL, on automated test equipment. This also validates that the PLL is actually locked at the target frequency at any point in time. These methods and devices are therefore highly useful for characterizing PLL frequency to frequency transitions, and frequency verses time curves, and not just the PLL startup frequency verses time curve. Note that the addition of the counter/timer and PLL output amplifier features add insignificant cost to the PLL device overall.

In different implementations, such built in self-test (BIST) equipment is designed as a system on a chip (SOC) which can automatically provide the series of different delay counts to the counter device for the different frequency capture operations that will occur. Each individual capture operation begins with receipt of a PLL set signal, and ends with capture of a PLL frequency. Methods and devices herein can also utilize a test control unit and a stored test plan to control the different frequency capture operations. With the stored test plan, the test mode is invoked and the PLL data is collected by the automated test equipment. The stored test plan may be fixed in read only memory (ROM), or programmable in random access memory (RAM). In other alternatives, a boot ROM structure can invoke the test mode at the time of system boot up. Such structures/methods maximize the flexibility of the test environment, and enable capturing the PLL output frequency verses time characteristic curve in virtually any test environment using anything from automated test equipment (ATE) to system level testing in the customer's application.

FIG. 1 illustrates an exemplary device 101 that includes a counter device 122 having inputs for a set signal (PLL Freq. Set), for a clock signal (CLK), and for a time delay count signal (CTR/Timer In). Such a device 101 performs testing to capture the phase of a signal 106 being output by a phase-locked loop (PLL) device 102 at different delay counts, and item 101 is therefore sometimes referred to as a "capture" or "PLL" device. The set signal (PLL Freq. Set) is a PLL frequency set signal that is supplied to a set signal input of a PLL register 112. The set signal can be supplied from any other system or device, such as a logic device or processor 300. The PLL register 112, upon receipt of the set signal, causes the PLL circuit 102 to begin transitioning from a relatively lower frequency state to a relatively higher target frequency state (to transition to the PLL lock frequency). After expiration of a certain amount of time, the PLL circuit 102 eventually locks in at the target frequency and is used by many exterior devices as a source of a signal having a known, consistent output frequency. The details of PLL circuits/devices mentioned above are well-known to those ordinarily skilled in the art, and such details are not discussed herein for brevity and reader focus.

A frequency detector 114 captures the frequency of the output 106 of the PLL circuit 102 (potentially amplified by amplifier 104) when the counter device 122 outputs a trigger signal (potentially amplified by amplifier 124). The frequency detector 114 can be any device capable of detecting the frequency of the signal being output 106 from the PLL circuit 102 (e.g., oscilloscope, frequency counter device, spectrum analyzer, etc.). The frequency detector 114 captures (meaning detects/senses and outputs) the frequency of the signal on the output 106 of the PLL circuit 102 at the time the trigger signal is received by the frequency detector 114.

During many successive PLL output frequency capture cycles, the counter device 122 performs different delay counts to cause the frequency detector 114 to capture the frequency of the output 106 of the PLL circuit 102 at different delay counts from the set signal, to evaluate the output 106 of the PLL circuit 102 at such different delay counts from the set signal. The delay counts herein can be in units of clock cycles, microseconds, or any other time/count measure. For each individual frequency capture operation, the counter device 122 receives one of many successive different delay counts into the time delay count signal input (CTR/Timer In). In a frequency capture operation, the counter device 122 counts the delay count that it has been supplied (using the pulse of the clock signal for each count) and outputs the trigger signal when the delay counts is complete. For purposes herein, a count is complete when a countdown is performed from the count number down to zero, or the counter device 122 counts up from zero to the count number.

The counter device 122 will be supplied different delay counts to perform multiple captures of the output 106 of the PLL circuit 102 at different delay counts from the set signal during multiple capture operations. During each individual capture operation, the counter device 122 begins counting (counting up from zero to a count number, or counting down to zero from a count number) a different time delay count when the set signal is detected at the input. The counter device 122 only counts one of the different delay counts during any given capture operation (of the multiple captures that will be performed). Therefore, the series of single delay counts (different from one another) can be supplied (potentially manually) to the counter device 122 to perform the series of individual captures.

These different time delays can be irregular, progressive, or exponentially spaced clock cycles, etc., that capture more data points (more frequencies) per unit of time at parts of the curve that are of relatively higher interest. For example, relatively less frequencies (less data points) can be captured per unit of time before the PLL frequency beings to increase, relatively more frequencies can be captured per unit of time while the PLL frequency is increasing and becoming stable, and again relatively less frequencies can be captured per unit of time after the PLL frequency has stabilized. Other irregular/progressive time delay patterns could be used also, depending upon testing goals.

In other words, each time after counting each different time delay count in each individual capture operation (of the series of capture operations) the counter device 122 supplies the frequency detector 114 the trigger signal, and the frequency detector 114 immediately captures the PLL circuit output 106 signal frequency being then currently output (e.g., captures a single frequency value). Each individual capture operation begins with receipt of a PLL set signal, and ends with capture of a PLL frequency. Therefore, through the performance of the series of capture operations, the PLL output 106 signal frequency at different counts from the set signal is detected by the frequency detector 114. Again, each individual capture in the series of capture operations uses only one time delay count and captures only one PLL circuit output 106 frequency; and, because the delay counts are different from one another in each of the individual captures in the series, this captures the PLL circuit output 106 signal frequency at different counts. Thus, the frequency detector 114 outputs a record of the frequency being then currently output 106 by the PLL circuit 102 at the different times when the trigger signal is received from the counter device 122.

Figure 2:
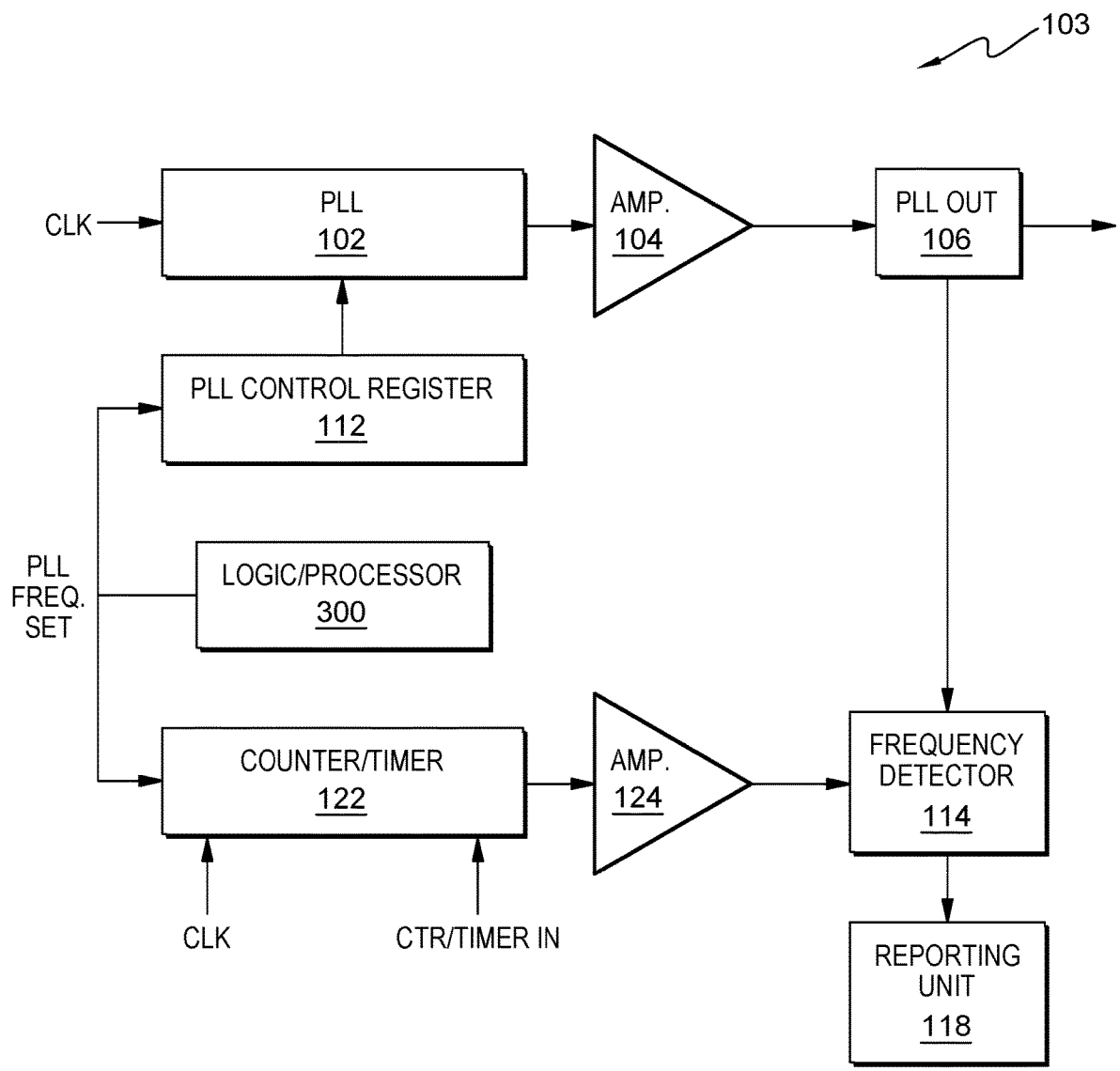

While the different frequencies of the PLL output 106 can be manually recorded after each capture operation in the series, in another exemplary capture or PLL device 103, shown in FIG. 2, a reporting unit 118 can be included. All elements identified by the same number in the drawings herein are the same, and a redundant discussion of such is avoided for brevity. Such a reporting unit 118 is connected to the frequency detector 114, and the reporting unit 118 stores the records of the frequencies being output by the PLL circuit 102 at the different delay counts performed during the different capture operations in the series.

Figure 3:
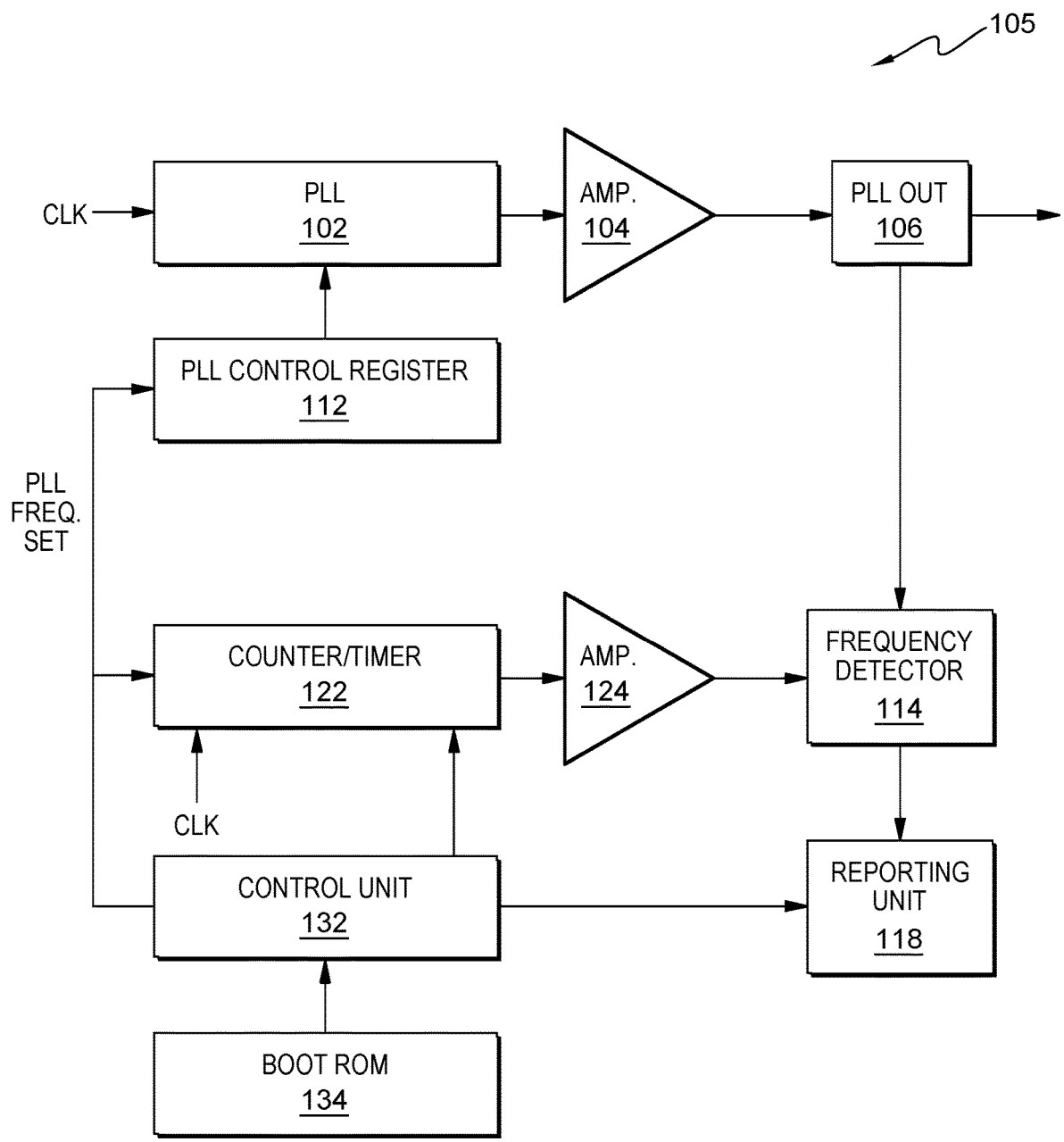

While the different delay counts can be manually supplied to the counter device 122, in another exemplary capture or PLL device 105, shown in FIG. 3, some implementations of these capture devices also include a control unit 132 connected to the counter device 122. Such a control unit 132, if included, controls the counter device 122 to perform multiple captures on the PLL circuit 102 using different delay counts. In greater detail, during each capture operation, the control unit 132 supplies only one of the different delay counts in the series of delay counts to the counter device 122, and can supply the PLL frequency set signal simultaneously to both the counter device 122 and the PLL control register 112 (which causes the counter device 122 to begin counting and the PLL circuit 102 to begin transitioning from the relatively lower frequency state to the relatively higher target frequency state (to transition to the PLL lock frequency).

As noted above, during such PLL output frequency capture operations, the counter device 122 begins counting (counting up from zero to a count number, or counting down to zero from a count number) a different time delay count each time the set signal is detected at the input. The counter device 122 only counts one of the different delay counts during any given capture operation of the multiple capture operations that will be performed. Again, the reporting unit 118 stores the record of the frequencies being output by the PLL circuit 102 for the different delay counts performed during the different capture operations in the series. As shown in FIG. 3, the control unit 132 can also be connected to the reporting unit 118, allowing the control unit 132 to control the reporting unit 118 to output (at the end of all PLL frequency capture operations) the different frequencies for the different delay counts that the reporting unit has stored.

Again, if the control unit 132 is not utilized (e.g., in the capture devices 101 and 103, shown in FIGS. 1 and 2 discussed above) a series of single delay counts (different from one another) can be supplied (potentially manually) to the counter device 122 to perform the series of individual captures. While both implementations achieve the same result, the use of the control unit 132 automates such a potentially manual process of supplying the different delay counts to the counter device 122.

Figure 4:
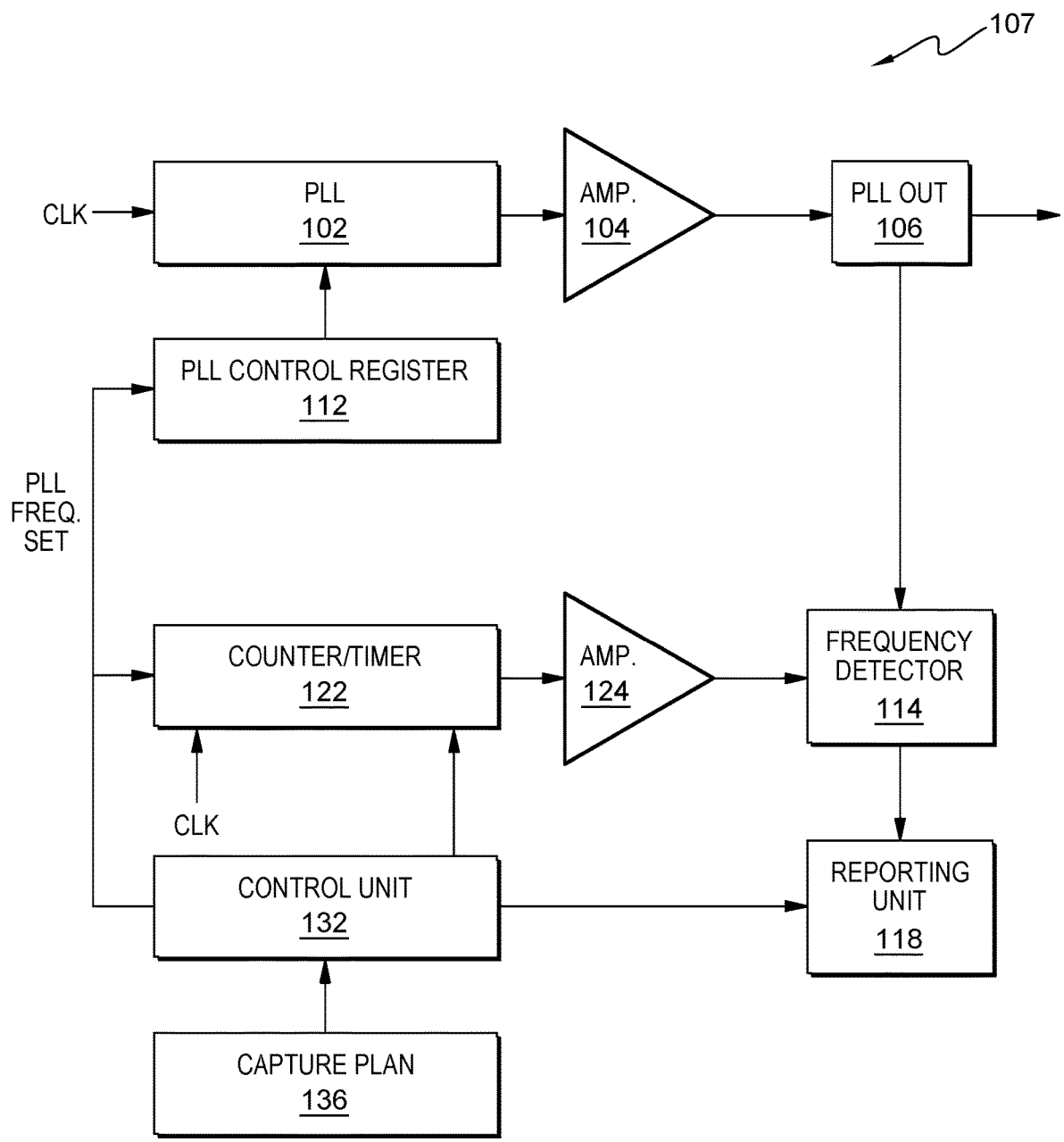

FIG. 3 also illustrates that the control unit 132 can be connected to a boot read only memory (ROM) 134. With such a structure, the boot ROM 134 can direct the control unit 132 to perform a series of capture operations whenever the PLL circuit 102 is activated (e.g., powered on, turned on, or booted up). In addition, in another capture or PLL device 107, shown in FIG. 4, the devices herein can include a capture plan 136 that is supplied to the control unit 132. The capture plan 136 potentially supplies many different series of delay counts to the control unit 132 to allow the control unit to perform different series of capture operations so as to evaluate the PLL circuit 102 in different ways.

Figure 5:
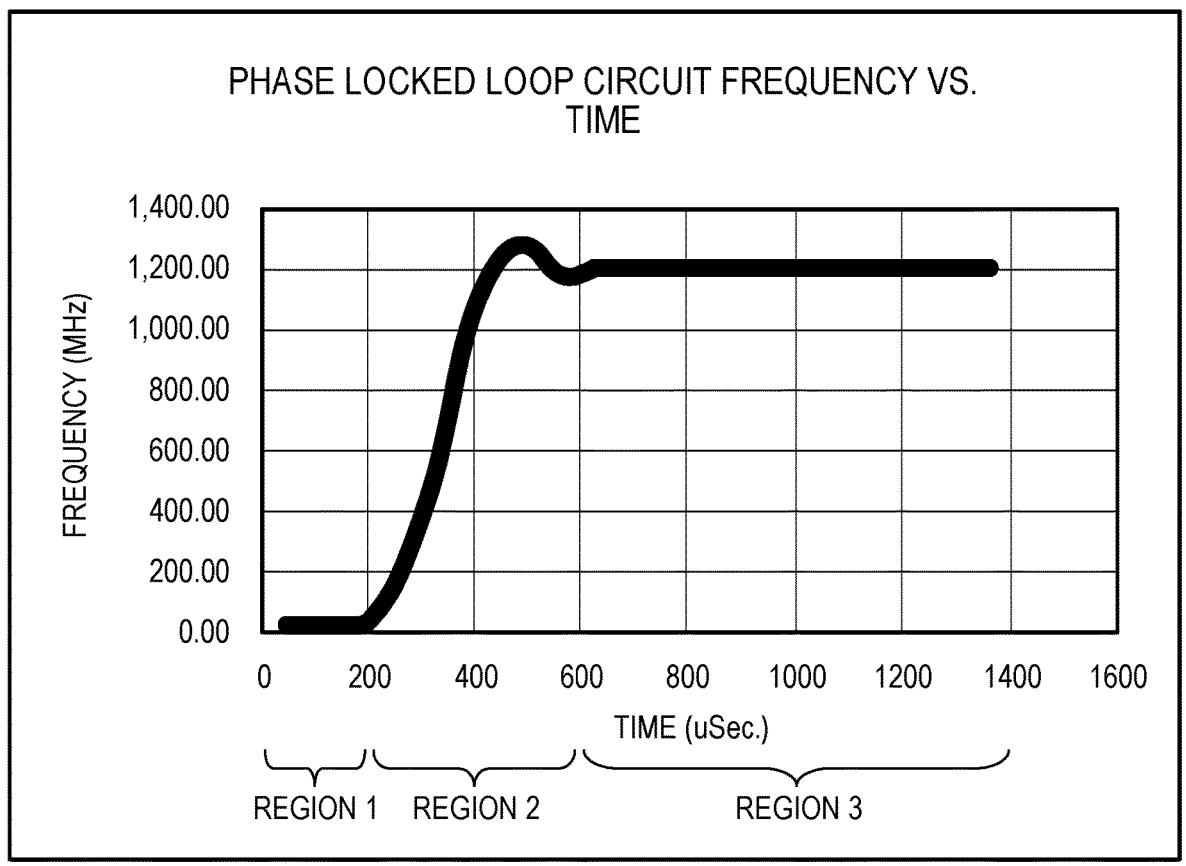
FIG. 5 is a diagram illustrating output produced by embodiments herein.

As noted above, the reporting unit 118 outputs the different frequencies for the different delay counts that the reporting unit has stored. FIG. 5, illustrates one example of such where the reporting unit 118 calculates and produces a plot of the different frequencies being output by the PLL circuit 102 at the different delay counts (and the reporting unit 118 can output such a plot). Such a plot shown in FIG. 5 is a curve of frequency over counts that illustrates the slope of the plot when the PLL circuit 102 is transitioning from the relatively lower frequency state to the relatively higher target frequency state, and also illustrates the number of oscillations that occur before the PLL circuit 102 finally locks at the target frequency state.

In FIG. 5, there are different regions in the graph. In a first region (Region 1) the PLL is in a steady state at the default (low) frequency. In a second region (Region 2), the PLL is in transition between the default (low) frequency state and its target (high) frequency state. In Region 3, the PLL has achieved lock at its target frequency.

As noted previously, the different time delays can be irregular, progressive, or exponentially spaced clock cycles, etc., that capture more data points (more frequencies) per unit of time at parts of the curve that are of relatively higher interest. For example, relatively less frequencies (less data points) can be captured per unit of time before the PLL frequency beings to increase in Region 1, such as one frequency capture operation every 10 clock cycles. Relatively more frequencies can be captured per unit of time while the PLL frequency is increasing and becoming stable in Region 2, such as one frequency capture operation every 2 clock cycles. Again relatively less frequencies can be captured per unit of time after the PLL frequency has stabilized in Region 3, such as one frequency capture operation every 15 clock cycles.

Designers of PLLs are interested in every aspect of the shape of a PLLs frequency verses time curve (or transfer function) because this plot describes various performance characteristics of the PLL. In one example, if the start of the plot (left most point in Region 1) represents the time at which the PLL is set to its target frequency, then the amount of time the PLL takes to reach its target frequency and lock at the target frequency (left most point in Region 3) is the difference in time between the first stable high frequency point in the plot and the beginning of the plot. The slope of the plot of the PLLs frequency verses time in the transition region (Region 2) and the number of oscillations about the target frequency provides insight into the stability of the PLL. Therefore, the methods and devices herein, which enable automated characterization of a PLLs frequency verses time curve (or transfer function) and the PLLs lock time, have high value.

Figure 6:
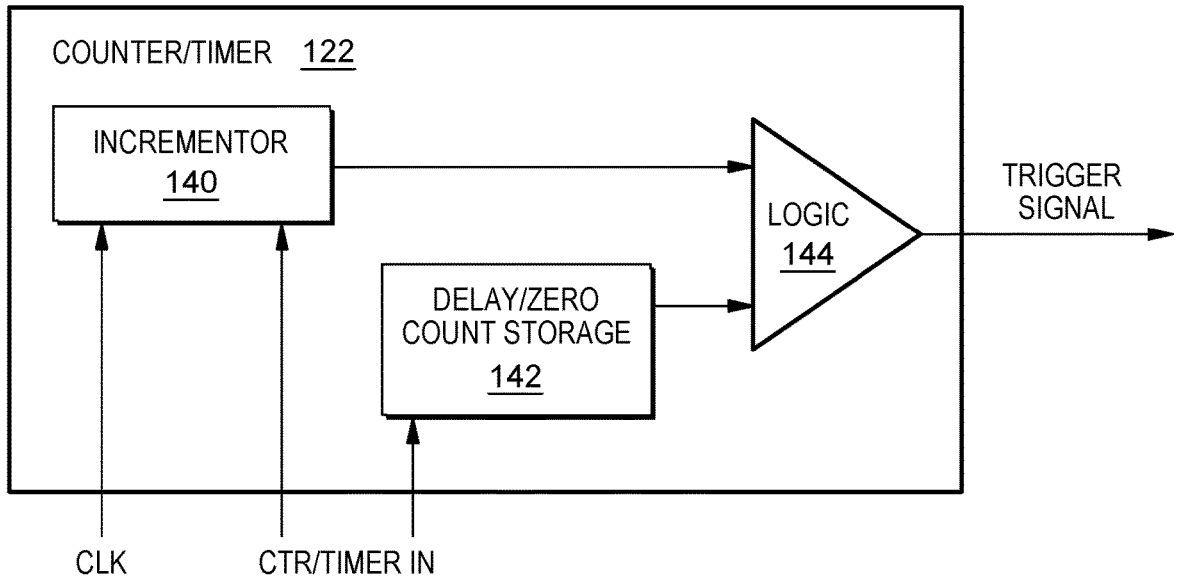
FIG. 6 is a schematic conceptual diagram of a counting device according to embodiments herein.

FIG. 6 demonstrates that the counter device 122 and the frequency detector 114 work together through a series of capture operations to produce a curve of frequency over counts to produce plots showing when the PLL circuit 102 is transitioning from the relatively lower frequency state to the relatively higher target frequency state.

To perform such operations, the counter device 122 can include delay count storage 142 to store the time delay count (CTR/Timer In), an incrementor 140 to count up from zero, and logic circuitry (e.g., a comparator, etc.) 144 that will output the trigger signal when the count of the incrementor 140 counts up to equals the delay count stored in the delay count storage 142. In other alternatives, the logic 144 can output the trigger signal when the incrementor 140 equals zero (if the incrementor started counting down from the delay count). This is only one example of the types of counting devices 122 that can be used with devices herein, and those ordinarily skilled in the art would understand that other similar counter devices could be used with the methods and devices herein.

Figure 7:
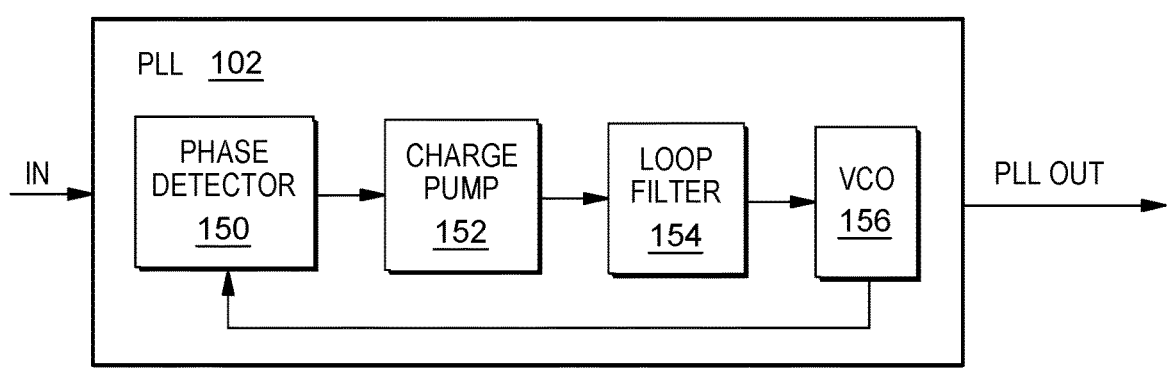
FIG. 7 is a schematic conceptual diagram of a PLL device according to embodiments herein.

Also, FIG. 7 is one example of how the PLL circuit 102 shown in FIGS. 1-4 could be implemented. As shown in FIG. 7, the PLL circuit 102 can include, among other components, a phase/frequency detector 150, a charge pump 152, a loop filter 154, a voltage controlled oscillator (VCO) 156. The voltage controlled oscillator 156 generates a clock signal with a phase and frequency that is a function of the voltage applied to the oscillator 156. The phase/frequency detector 150 detects the phase difference between the voltage controlled oscillator 156 output and the input signal (IN) to generate a phase control signal. This phase control signal is supplied to the charge pump 152, which increases or decreases the voltage across the loop filter 154, and such voltage controls the voltage controlled oscillator 156 to set the oscillation frequency and phase.

While more sophisticated and complex testing devices can be used to perform fully automated testing, with all testing completed in a single pass, such devices miss many of the features provided by devices and methods herein. Devices herein are manufactured as part of the PLL circuit/device (as an SOC BIST) which places emphasis on keeping these devices small (so as to not consume significant amounts of valuable chip area) and of reduced complexity (so as to not consume significant amounts of design resources). Therefore, these devices use low complexity hardware (a counter/incrementor 140, a small amount of memory 142, a simple two-input comparator 144, etc.) that only permits a single frequency to be captured per capture operation. Such devices do not consume substantial amounts of chip area, power, design resources, etc.; and even if additional elements (e.g., control unit 132, memory for a capture plan 136, memory for a reporting unit 118, etc.) are included within the design, again such devices are kept consistent with the purpose of not consuming substantial amounts of chip area, power, design resources, etc.

Further, the testing devices 101, 103, 105, 107 described above may be included within many differently designed PLL circuits. The simplified design of such testing devices 101, 103, 105, 107 allows the pattern of counts at which frequencies are captured to be changed very easily (e.g., simply by supplying different counts manually, or by simply programming different counts into the capture plan 136) without incurring substantial programming overhead that would be needed in more sophisticated testing devices. This is highly useful because the performance of the different PLL circuit designs being tested will be unknown, and this can necessitate many different ranges of counts being utilized before the details of the count verses frequency curve are discovered. This allows the testing devices 101, 103, 105, 107 described to be used flexibly with very little programming effort/cost (merely changing counts) to quickly evaluate new designs that can produce unexpected frequency verses count curves, while more sophisticated testing equipment cannot be used as easily to react to unexpected outputs from new PLL circuit designs.

Therefore, the devices described herein require less chip area, less hardware design/manufacturing resources, less software design resources compared to more complex systems. Further, because the devices and methods herein begin each count from the PLL set signal, these devices and methods produce a frequency verses count curve that defines a zero point of time when the PLL was set to its target frequency; which allows for direct frequency measurement of the PLL as a function of time, allows direct measurement of the PLLs lock time, allows direct measurement of a PLLs frequency, etc. This permits simplified testing that more accurately characterized different PLL circuit designs than could be achieved with more expensive, more sophisticated testing equipment.

Figure 8:
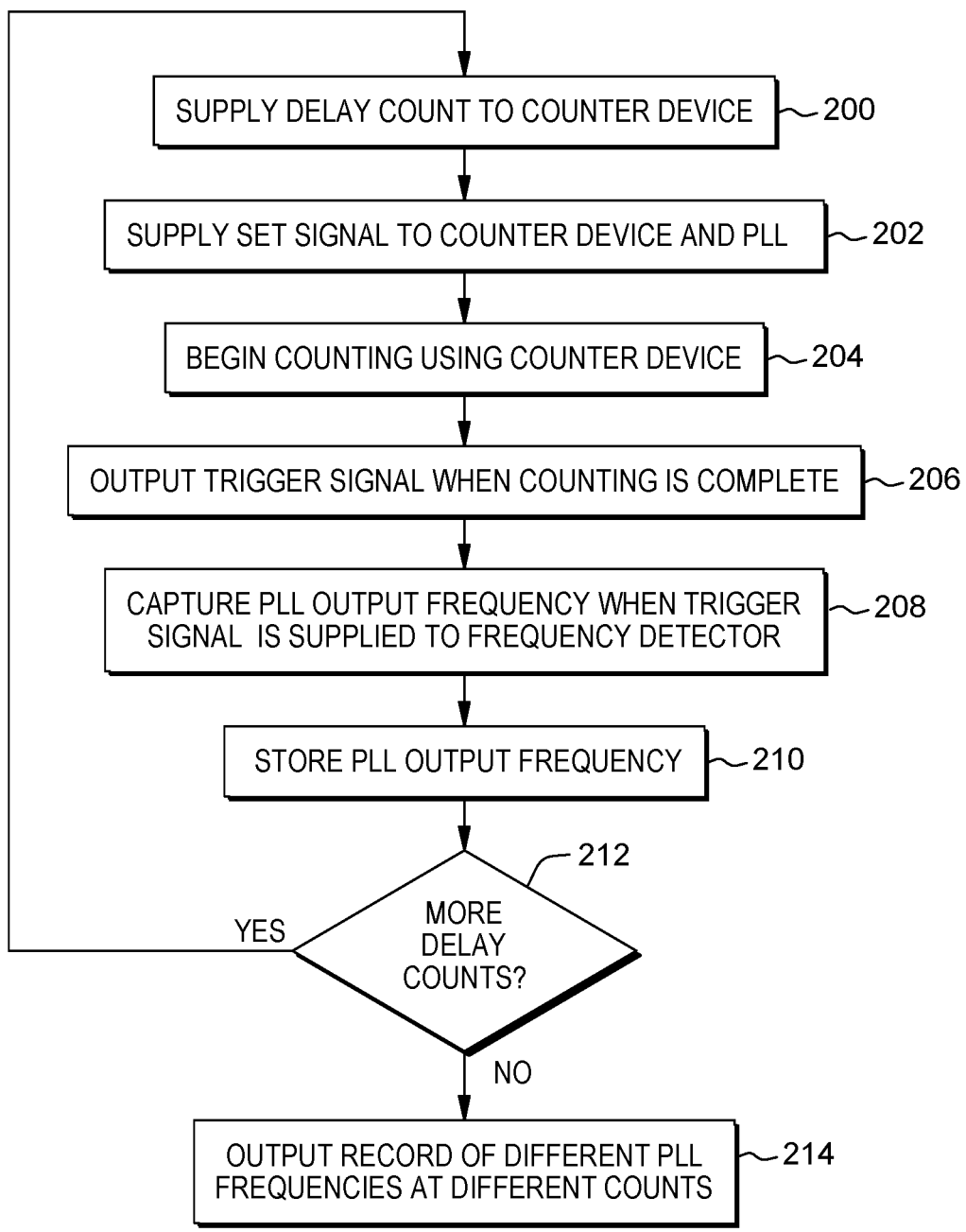
FIG. 8 is a flow diagram illustrating embodiments herein.

As shown in flowchart form in FIG. 8, various methods herein can control a counter to perform multiple captures on a PLL device by supplying one of many different delay counts in a series (potentially using a control unit) to the counter device, in item 200. The process of supplying different delay counts supplies one of the delay counts at a time to an input of the counter device (supplied one count per capture operation). These methods also supply a set signal to the counter and the PLL device in item 202, for each of the multiple captures performed on the PLL device. Again, the set signal is a PLL frequency set signal that is supplied to the PLL register, and that causes the PLL device to transition from a relatively lower frequency state to a relatively higher target frequency state.

A clock signal is received into a clock signal input of the counter to provide a basis upon which the counter performs counting operations. In item 204, these methods begin counting a different delay count each time the set signal is detected at the input of the counter, and output a trigger signal from the counter each time each of the different delay counts is complete in item 206. Such processing can amplify the trigger signal output from the counter using an amplifier connected to the counter. In item 208 a frequency detector is used to capture the frequency being output by the PLL device each time the trigger signal is received. Also, such methods can store the record of the frequency being output by the PLL device for multiple different delay counts using a reporting unit connected to the frequency detector in item 210. Processing loops back to item 200 until there are no more delay counts in the series of delay counts in item 212.

This allows these methods to output a record of the frequency being output by the PLL device for each different time delay count in item 214. In one example, the methods herein can calculate/produce a plot (see FIG. 5) of different frequencies being output by the PLL device at different delay counts using the reporting unit in item 214, where the plot can be output from the reporting unit. Again, the plot in item 214 can be a curve of frequency over counts that illustrate the slope of the plot when the PLL device is transitioning from the relatively lower frequency state to the relatively higher target frequency state, and also illustrates the number of oscillations that occur before the PLL device locks at the target frequency state.

Again, each time after counting each different time delay count in each individual capture of the series of capture operations, the trigger signal is produced (206) and the frequency detector captures the PLL device frequency (208). Therefore, through the performance of the series of capture operations (each series including items 200-212), the frequency detector captures the PLL frequency at different counts from the set signal. Again, each individual capture (208) in the series of capture operations (200-212) uses only one time delay count and captures only one PLL device frequency to create one point on the plot; and, because the delay counts are different from one another in each of the individual captures, this captures the PLL device frequency at different counts, allowing the record of the frequency being output by the PLL device for each different time delay count to be output in item 214.

Figure 9:
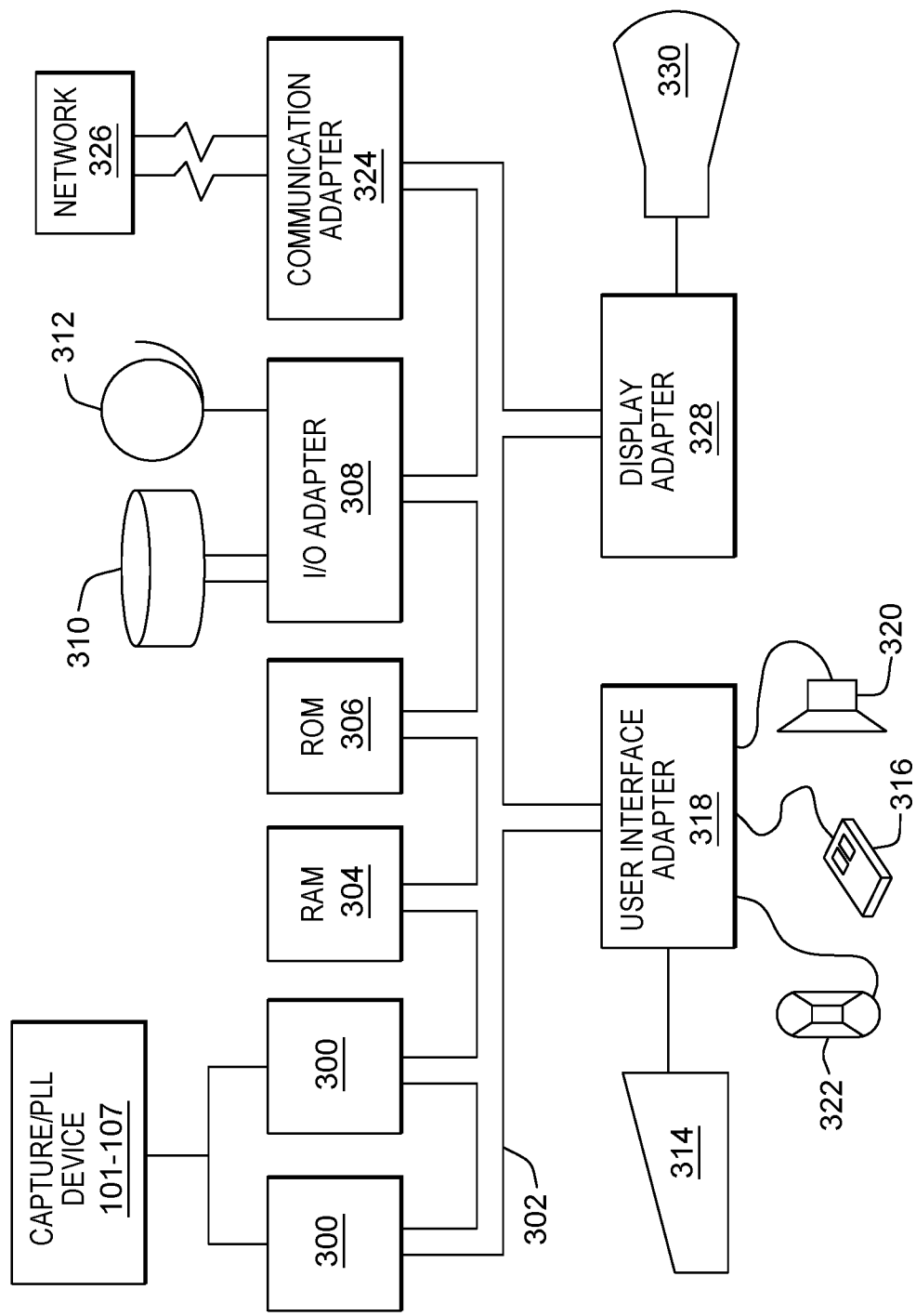
FIG. 9 is a schematic diagram of a hardware system according to embodiments herein.

A representative hardware environment (i.e., a computer system) for implementing the systems, methods and computer program products disclosed above is depicted in FIG. 9. This schematic drawing illustrates a hardware configuration of an information handling/computer system in accordance with the embodiments herein. The system incorporates at least one processor or central processing unit (CPU) 300 connected to the various capture or PLL devices 101-107 discussed above. The CPUs 300 are also interconnected via a system bus 302 to various devices such as a random access memory (RAM) 304, read-only memory (ROM) 306, and an input/output (I/O) adapter 308. The I/O adapter 308 can connect to peripheral devices, such as disk units 310 and tape drives 312, or other program storage devices that are readable by the system. The system can read the inventive instructions on the program storage devices and follow these instructions to execute the methodology of the embodiments herein. The system further includes a user interface adapter 318 that connects a keyboard 314, mouse 316, speaker 320, microphone 322, and/or other user interface devices such as a touch screen device (not shown) to the bus 302 to gather user input. Additionally, a communication adapter 324 connects the bus 302 to a data processing network 326, and a display adapter 328 connects the bus 302 to a display device 330 which may be embodied as an output device such as a monitor, printer, or transmitter, for example.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Each respective figure, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method described above. In other words, one or more computer hardware devices can be created that are configured to implement the method and processes described herein with reference to the figures and their corresponding descriptions.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A capture device comprising:
   a counter having an input for a set signal, wherein the set signal is a phase-locked loop (PLL) frequency set signal supplied to a PLL register causing a PLL circuit to transition from a relatively lower frequency state to a relatively higher target frequency state, wherein the counter begins counting a time delay count when the set signal is detected at the input, and wherein the counter outputs a trigger signal when the counting of the time delay count is complete; and
   a frequency detector connected to the PLL circuit, wherein the frequency detector captures a frequency being output by the PLL circuit when the trigger signal is received by the frequency detector, and wherein the frequency detector outputs a record of the frequency being output by the PLL circuit after receiving the trigger signal.

2. The capture device in claim 1, further comprising an amplifier connected to the counter and amplifying the trigger signal from the counter.

3. The capture device in claim 1, further comprising a reporting unit connected to the frequency detector and storing the record of the frequency being output by the PLL circuit for multiple different delay counts.

4. The capture device in claim 3, wherein the reporting unit calculates a plot of different frequencies being output by the PLL circuit at different delay counts and outputs the plot.

5. The capture device in claim 4, wherein the plot comprises a curve of frequency over counts that illustrates:
a slope of the plot when the PLL circuit is transitioning from the relatively lower frequency state to the relatively higher target frequency state; and
a number of oscillations that occur before the PLL circuit locks at the target frequency state.

6. The capture device in claim 1, wherein the counter includes a time delay count input for receiving different delay counts, and a clock input for receiving a clock signal.

7. The capture device in claim 1, wherein the counter includes storage to store the time delay count, and logic circuitry to output the trigger signal when the counting of the time delay count is complete.

8. A device comprising:
a phase-locked loop (PLL) circuit;
a PLL register connected to the PLL circuit;
a counter having an input for a set signal, wherein the set signal is a PLL frequency set signal supplied to the PLL register causing the PLL circuit to transition from a relatively lower frequency state to a relatively higher target frequency state;
a control unit connected to the counter, wherein the control unit controls the counter to perform multiple captures on the PLL circuit using different delay counts, wherein the counter begins counting one of the different delay counts each time the set signal is detected at the input, and wherein the counter outputs a trigger signal each time each of the different delay counts is complete; and
a frequency detector connected to the PLL circuit, wherein the frequency detector captures a frequency being output by the PLL circuit each time the trigger signal is received by the frequency detector, and wherein the frequency detector outputs a record of the frequency being output by the PLL circuit after receiving each trigger signal.

9. The device in claim 8, further comprising an amplifier connected to the counter and amplifying the trigger signal from the counter.

10. The device in claim 8, further comprising a reporting unit connected to the frequency detector and storing the record of the frequency being output by the PLL circuit for the different delay counts.

11. The device in claim 10, wherein the reporting unit calculates a plot of different frequencies being output by the PLL circuit at the different delay counts and outputs the plot.

12. The device in claim 11, wherein the plot comprises a curve of frequency over counts that illustrates:
a slope of the plot when the PLL circuit is transitioning from the relatively lower frequency state to the relatively higher target frequency state; and
a number of oscillations that occur before the PLL circuit locks at the target frequency state.

13. The device in claim 8, wherein the counter includes a time delay count input for receiving the different delay counts, and a clock input for receiving a clock signal.

14. The device in claim 8, wherein the counter includes storage to store the different delay counts, and logic circuitry to output the trigger signal when the counting of each delay count is complete.

15. A method comprising:
supplying a set signal to a counter, wherein the set signal is a phase-locked loop (PLL) frequency set signal supplied to a PLL register causing a PLL circuit to transition from a relatively lower frequency state to a relatively higher target frequency state;
begin counting a time delay count when the set signal is detected by the counter;
outputting a trigger signal from the counter when the counting of the time delay count is complete;
capturing a frequency being output by the PLL circuit when the trigger signal is received by a frequency detector; and
outputting a record of the frequency being output by the PLL circuit after receiving the trigger signal from the frequency detector.

16. The method in claim 15, further comprising amplifying the trigger signal output from the counter using an amplifier connected to the counter.

17. The method in claim 15, further comprising storing the record of the frequency being output by the PLL circuit for multiple different delay counts using a reporting unit connected to the frequency detector.

18. The method in claim 17, further comprising calculating a plot of different frequencies being output by the PLL circuit at different delay counts using the reporting unit; and
outputting the plot from the reporting unit.

19. The method in claim 18, wherein the plot comprises a curve of frequency over counts that illustrates:
a slope of the plot when the PLL circuit is transitioning from the relatively lower frequency state to the relatively higher target frequency state; and
a number of oscillations that occur before the PLL circuit locks at the target frequency state.

20. The method in claim 15, further comprising receiving a clock signal into a clock signal input of the counter.

* * * * *